(12) United States Patent
Coppola

(10) Patent No.: US 6,545,564 B1
(45) Date of Patent: Apr. 8, 2003

(54) RF SIGNAL DIVIDER

(75) Inventor: Theodore A. Coppola, Marlborough, MA (US)

(73) Assignee: Signal Technology Corporation, Danvers, MA (US)

( * ) Notice: Subject to any disclaimer, the term of this patent is extended or adjusted under 35 U.S.C. 154(b) by 0 days.

(21) Appl. No.: 09/557,432

(22) Filed: Apr. 25, 2000

(51) Int. Cl.[7] .................................................. H03H 7/38
(52) U.S. Cl. ...................................... 333/124; 333/136
(58) Field of Search ................................ 333/124, 128, 333/127, 136, 156, 160, 161

(56) References Cited

U.S. PATENT DOCUMENTS

| | | | |
|---|---|---|---|
| 3,990,024 A | 11/1976 | Hou | 333/33 |
| 4,463,326 A | 7/1984 | Hom | 333/128 |
| 4,626,805 A | 12/1986 | Jones | 333/33 |
| 4,647,868 A | 3/1987 | Mueller | 330/286 |
| 4,673,889 A | 6/1987 | Jespersen et al. | 333/137 |
| 4,835,496 A | 5/1989 | Schellenberg et al. | 333/128 |
| 4,893,093 A | 1/1990 | Cronauer et al. | 330/295 |
| 4,968,958 A | 11/1990 | Hoare | 333/128 |
| 5,017,886 A | 5/1991 | Geller | 330/277 |
| 5,021,755 A | 6/1991 | Gustafson | 333/128 |
| 5,025,233 A | 6/1991 | Leonakis | 333/128 |
| 5,111,166 A | 5/1992 | Plonka et al. | 333/128 |
| 5,132,641 A | 7/1992 | Khandavalli | 330/295 |
| 5,160,904 A | 11/1992 | Babbitt et al. | 333/34 |
| 5,164,689 A | 11/1992 | Plonka | 333/128 |
| 5,173,666 A | 12/1992 | Babbitt et al. | 333/33 |
| 5,187,447 A | 2/1993 | Tsai | 333/124 |
| 5,200,719 A | 4/1993 | Margulis et al. | 333/34 |
| 5,247,264 A | 9/1993 | Cripe | 330/251 |
| 5,264,810 A | 11/1993 | Sager et al. | 333/131 |
| 5,313,174 A | 5/1994 | Edwards | 333/109 |
| 5,334,957 A | 8/1994 | Koontz | 333/131 |
| 5,363,072 A * | 11/1994 | Sakamoto et al. | 333/125 |
| 5,543,751 A * | 8/1996 | Stedman et al. | 330/124 D |
| 5,576,671 A | 11/1996 | Agar, Jr. et al. | 333/128 |
| 5,662,816 A | 9/1997 | Andry | 216/18 |
| 5,668,510 A | 9/1997 | Humphreys | 333/127 |
| 5,754,082 A | 5/1998 | Swanson | 333/124 |
| 5,790,517 A | 8/1998 | Meredith | 370/210 |
| 5,796,317 A | 8/1998 | Bohlman et al. | 333/127 |
| 5,872,491 A * | 2/1999 | Kim et al. | 333/101 |
| 5,880,638 A | 3/1999 | Aves et al. | 333/127 |

* cited by examiner

*Primary Examiner*—Robert Pascal
*Assistant Examiner*—Kimberly E. Glenn
(74) *Attorney, Agent, or Firm*—George A. Herbster

(57) ABSTRACT

An RF signal divider useful in the 250 to 2500 MHz range includes an RF input connection and a plurality of RF output connections. A resistive path connects each RF output connection from an RF output connection with a impedance $Z_L$ to a common node with an impedance $Z_Q$. An input impedance transformer couples an RF input connection with an input impedance $Z_L$ to the common node. This RF signal divider is characterized by good insertion loss variation and isolation over the entire frequency range and by a minimal circuit area.

15 Claims, 6 Drawing Sheets

RF SIGNAL DIVIDER

BACKGROUND OF THE INVENTION

1. Field of the Invention

This invention generally relates to RF circuits and more specifically to an RF signal divider that is operable over a broad bandwidth.

2. Description of Related Art

Wireless RF applications in the 200 to 3000 MHz range, particularly in the 800 to 1000 MHz and 1900 to 2400 MHz bands, have become wide spread in recent years. These are frequencies of choice for wireless telephones and similar communication applications. Particular effort has been directed to the development of the RF transmitting and receiving facilities for such applications including wireless telephone repeaters or cells.

In many of these applications it is necessary to split or divide a low-level received RF input signal into a high-power RF output signal is transmitted to other cells or telephones. In a repeater or cell application, for example, a received signal from an antenna may be amplified in a preamplifier stage and then split and fed through multiple parallel power amplifiers to be recombined as a RF output signal.

A number of RF signal dividers and combiners have been proposed for such applications. For example, the well known Wilkinson circuit uses transmission lines at a characteristic impedance to convey signals to different ports. The ports are tied through transmission lines to a common node. The transmission lines may be a quarter wavelength ($\lambda/4$) in length.

Variations on the Wilkinson circuit have been proposed. For example, U.S. Pat. No. 4,463,326 (1984) to Hom discloses a microwave combiner and divider circuit that uses microstrips, or strip line, media. A common signal port feeds a division point through a capacitive stub and two-stage ring-type impedance matching circuit. Multiple circuit traces emanate from the division point to N individual branch ports. Strip line circuitry between the division point and branch ports provides compensation for phase reversal. Resistors are provided for branch port isolation.

U.S. Pat. No. 4,968,958 (1990) to Hoare discloses an RF signal divider that also uses strip line components to produce various transmission lines. Specifically, a metallic layer in a divider tapers laterally outwardly from an input port and then splits into at least two tapering conductors for the output ports. A resistive network provides isolation.

U.S. Pat. No. 4,893,093 (1990) to Cronauer et al. discloses a splitter in which a high frequency input signal is applied to a plurality of amplifiers. First transmission lines connect the input and each of the amplifiers. Each transmission line can be switched between high and low impedance levels. A balanced resistor network preferably interconnects the first transmission lines. Second transmission lines shunt the first transmission lines. The impedance of each second transmission line can be altered to a predetermined percentage of the circuit input impedance. A control circuit switches the various transmission lines so that the impedance of the antenna remains balanced no matter how many of the first transmission lines are in the high impedance state.

Another approach to dividing RF signals involves the utilization of transformers and hybrid couplers. U.S. Pat. No. 5,264,810 (1993) to Sager et al. discloses one such circuit in the form of a three-way divider in which signals from an amplifier energize three transformer primary windings in series. First secondary windings couple RF signals to three output amplifiers. Second secondary transformer windings and resistors maintain signal balance.

U.S. Pat. No. 5,313,174 (1994) to Edwards discloses a power splitter that maintains quadrature phase over the entire bandwidth of an input signal. This structure uses a combination of strip line technology and hybrid couplers to provide the appropriate output signals in phase quadrature.

Other patents utilize a combination of transmission lines and resistors. For example, U.S. Pat. No. 5,021,755 (1991) to Gustafson discloses an N-way signal splitter with a printed circuit board geometry and orthogonal resistive components. This circuit includes an impedance matching input circuit and a splitter circuit using both transmission lines and resistors.

U.S. Pat. No. 5,872,491 (1999) to Kim et al. disclose a Wilkinson-type power divider/combiner that has a selective switching capability. The switchable power divider/combiner includes N first switches connecting N input/output transmission lines to a common junction and N second switches connecting N isolation resistors coupled to the N input/output transmission lines to a common node. The activation of each pair of the first and second switches to a closed or opened switch position controls the operating mode.

Generally speaking prior art RF dividers are designed for operation at a fixed frequency or, at most, over a limited design frequency range or band. Physical size limits in such applications constrain the range or band. Within the design frequency range such RF dividers operate with good insertion loss and isolation characteristics. If such an RF divider operates at a frequency outside the design frequency range, however, these characteristics deteriorate. This deterioration is due in large part to the frequency dependency of power division and isolation mechanisms that the prior art RF signal dividers use.

For example, the common node impedance of each branch of a Wilkinson-type RF signal divider is greater than the characteristic impedance of the circuit in which the RF signal divider is used. This produces an impedance mismatch at the entrance to the branch that is frequency dependent. While a specific design can maintain this impedance mismatch within acceptable limits over the design frequency range, at some operating frequency outside the design frequency range the impedance mismatch will become unacceptable. More specifically, the impedance mismatch determines a proportional fraction of the power at a common node can transfer into the branch. This is an inverse relationship. Consequently, as the number of branches from the common node increase, the higher the impedance mismatch, the lower the proportional fraction and the less power transferred.

In Wilkinson-type RF signal dividers resistive paths provide isolation among the signals that transfer over the various divider branches. These resistive paths are typically selected to introduce appropriate phase differences in signals that provide signal cancellation. However, the effect of these paths is also frequency dependent. Such paths provide good isolation over a limited design frequency range. However, as the operating frequency for such an RF signal divider moves outside the design frequency range, the signal isolation reduces.

However, there are situations in which it is desirable to use a single compact RF divider in variable frequency applications where the frequency range is quite large. There are other situations in which is desirable to use multiple RF signal dividers of one type in different fixed frequency applications with multiple fixed operating frequencies. These prior art RF signal dividers do not operate with uniformly good insertion loss and isolation characteristics in either of the foregoing situations. That is, in use such prior art RF signal dividers, that are subject to a size constraint, exhibit marked decreases in insertion loss and isolation characteristics in situations requiring either a single RF divider to operate over a wide frequency range or a single RF divider to operate at different fixed frequencies spread across a wide frequency range.

SUMMARY

Therefore, it is an object of this invention to provide a compact RF signal divider that can be used in systems operating over a wide frequency range.

Another object of this invention is to provide an RF signal divider that can operate an any frequency in a wide range of frequencies with uniform insertion loss.

Still another object of this invention is to provide an RF signal divider that can operate at any frequency in a wide range of frequencies with uniformly high isolation.

In accordance with this invention an RF signal divider converts a received single RF input signal to a plurality of RF output signals of equal amplitude and phase. The RF divider comprises an input impedance transformer for receiving the RF input signal and a resistive path for each of the plurality of RF output signals. Each resistive path conveys its respective RF signal from the input impedance transformer as an RF output signal.

In accordance with another aspect of this invention, an RF divider comprises an RF input connection for receiving RF signals from an RF source and a plurality of RF output connections. A resistive path extends from each RF output connection to a common node. An RF impedance transformation path extends between the common node and the RF input connection. RF signals from the RF input connection pass through the RF transformation path and divide among the plurality of resistive paths to provide a plurality of RF signals of equal amplitude and phase at the RF output connections.

In accordance with yet another aspect of this invention, an RF signal divider comprises an RF input connection for receiving RF signals from an RF source and a plurality of RF output connections. A resistive path constitutes a sole RF path from each RF output connection to a common node. An RF impedance transformation path constitutes a sole RF path between the common node and the RF input connection. Signals at the RF input connection pass through the RF transformation path and divide among the plurality of resistive paths to provide a plurality of RF signals of equal amplitude and phase at the RF output connections.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
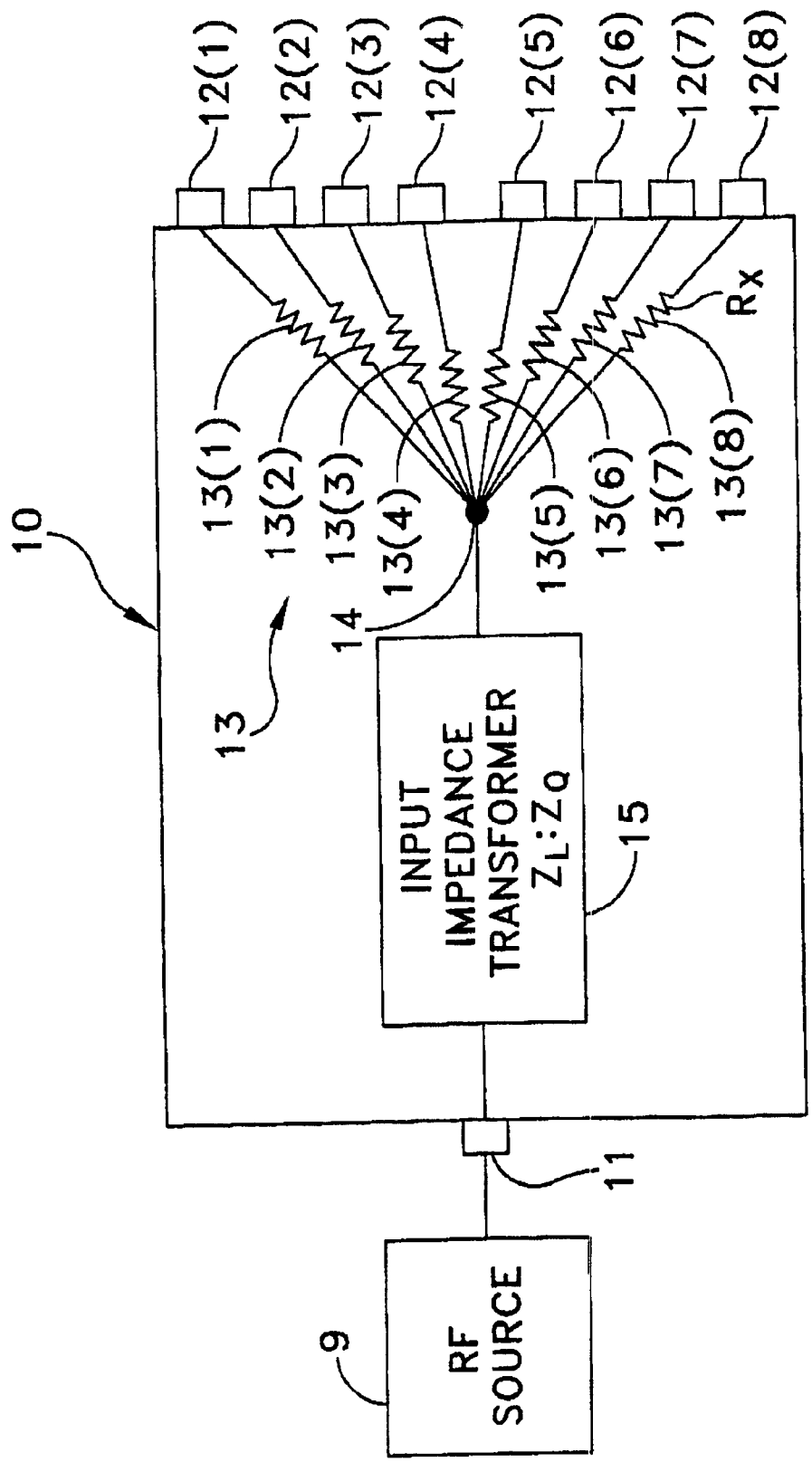
FIG. 1 is a schematic of an RF signal divider constructed in accordance with this invention.

FIG. 1 depicts an N-way RF signal divider 10 that includes an RF input connection 11 for receiving RF signals from an RF source 9. The RF signal divider 10 has N output connections. FIG. 1 specifically depicts an eight-way signal divider, i.e., N=8 with output connections 12(1) through 12(8). Typically each output connection connects to an individual amplifier for amplifying each of the signals in parallel with other signals split from the RF input signal.

An RF signal divider 10 constructed in accordance with this invention includes a set 13 of resistive paths extending from each RF output connection to a common node. In the particular embodiment shown in FIG. 1, the resistive paths comprise eight resistors 13(1) through 13(8). One end of each of the resistive paths 13(1) through 13(8) connects respectively to an RF output connection 12(1) through 12(8). The other ends of the resistive paths 13(1) through 13(8) connect to a common node 14. Each of the paths has an equal electrical length and equal resistive value. Moreover, each resistive path constitutes a sole RF signal path between the common node 14 and the respective one of the output connections. For example, the RF signal path from the common node 14 to the output RF connection 12(1) includes only the resistive path 13(1).

The RF signal divider 10 also includes an input impedance transformer 15 that matches the input impedance at the RF input connection to the impedance of the common node 14 produced by the resistive path set 13. Using $Z_L$ to identify the characteristic impedance of the system and $Z_Q$ to identify the impedance at the common node 14, the input impedance transformer 15 should produce a transformation:

$$Z_L:Z_Q \quad (1)$$

As will be apparent from viewing FIG. 1, with multiple paths from the output connections 12(1) through 12(8) the impedance $Z_Q$ at the common node 14 will be less than the characteristic impedance $Z_L$.

Figure 2:
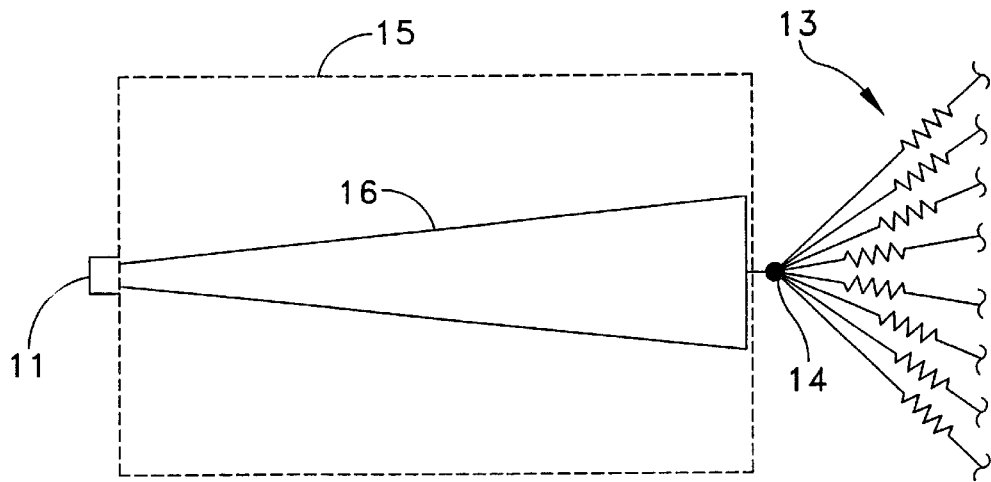
FIG. 2 is one embodiment of an input impedance transformer shown in FIG. 1.

FIG. 2 depicts one implementation of an input impedance transformer 15. More specifically this embodiment comprises a tapered transmission line 16 that has an impedance $Z_L$ at the RF input connection 11 and an impedance $Z_Q$ to the resistive path set 13 at the common node 14. The construction of such impedance transformers is known in the art.

Figure 3:
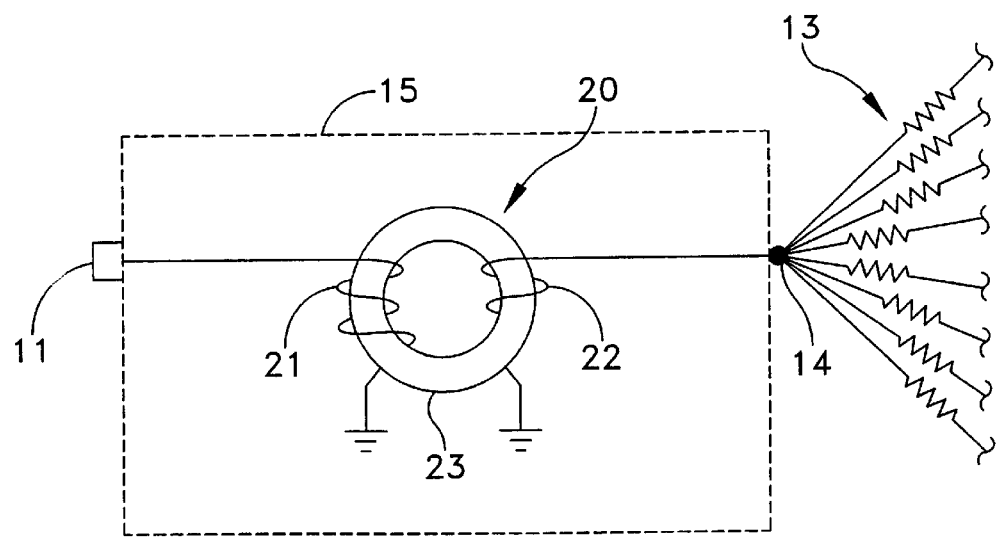
FIG. 3 is another embodiment of an input impedance transformer shown in FIG. 1.

FIG. 3 depicts another implementation of the input impedance transformer 15 that includes an RF transformer in the particular form of a wound ferrite RF transformer 20. In this specific embodiment the wound ferrite RF transformer includes a primary winding 21 and a secondary winding 22 wound on a ferrite core 23. The primary winding 21 has an input impedance $Z_L$. The impedance of the secondary winding 22 at the common node 14 is $Z_Q$. Such transformer-based impedance transformers are also known in the art.

Referring again to FIG. 1, the resistors 13(1) through 13(8) in the resistive path set 13 provide an impedance transformation between the common node 14 and the RF output connections 12(1) through 12(8). The resistor value, $R_X$ is given by:

$$R_X = \frac{N-1}{N+1} Z_L \quad (2)$$

Once the value of $R_X$ is determined, the value of impedance of the common node 14, $Z_Q$, becomes:

$$Z_Q = \frac{Z_L + R_X}{N} \quad (3)$$

Further analysis of the circuit shown in FIG. 1 leads to a sense of the insertion loss and isolation characteristics of the N-way RF signal divider 10. Specifically, the insertion loss is given by:

$$InsertionLoss\ (dB) = 20\log\left[\sqrt{\frac{Z_Q}{Z_L}} \cdot \frac{Z_L}{(Z_L + R_X)}\right] + 10\log(N) \quad (4)$$

and the isolation is given by:

$$Isolation\ (dB) = 20\log\left[\frac{(Z'Z_L)}{(Z' + R_X)(Z_L + R_X)}\right] \quad (5)$$

where $$Z' = \left[\frac{1}{Z_Q} + \frac{N}{Z_L + R_X}\right]^{-1} \quad (6)$$

Now looking at a specific eight-way RF signal divider 10 shown in FIG. 1 and assuming a 50-ohm characteristic impedance (i.e., $Z_L$=50), equation (2) yields a value $R_X$=38 ohms. If a designer were to elect to use a 38.0 ohm resistor, equation (3) would establish a requirement for $Z_Q$=11.1 ohms. However, a more economical design could be implemented by selecting a close standard resistor value, such as $R_X$=36 ohms. This produces a requirement for a value $Z_Q$=10.75 ohms. Equations (4) and (5) then predict an insertion loss of −2.36 dB and isolation of −22.4 dB, respectively.

Figure 4:
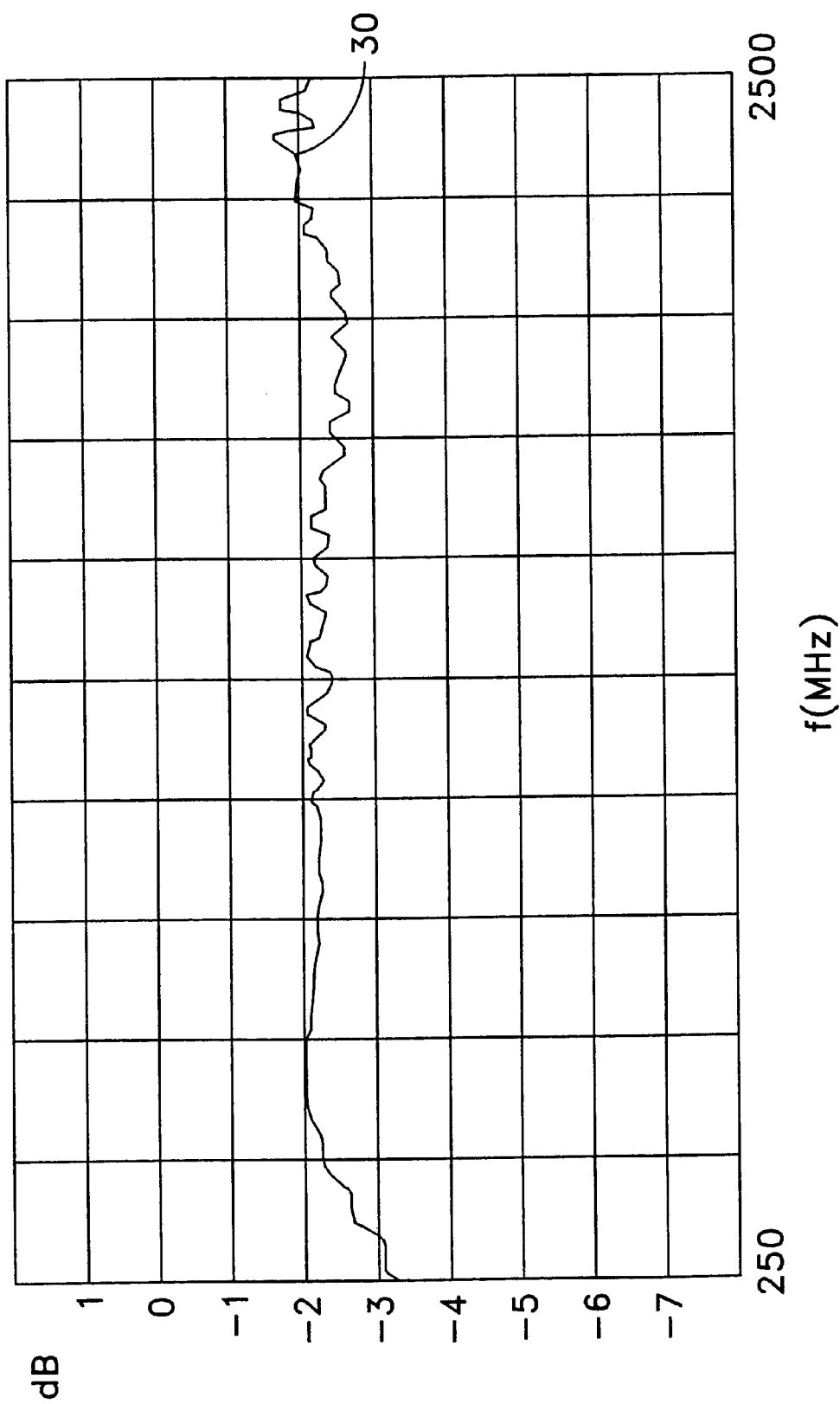
FIG. 4 is a graph depicting an insertion loss characteristic for the RF signal divider shown in FIG. 1.
Figure 5:
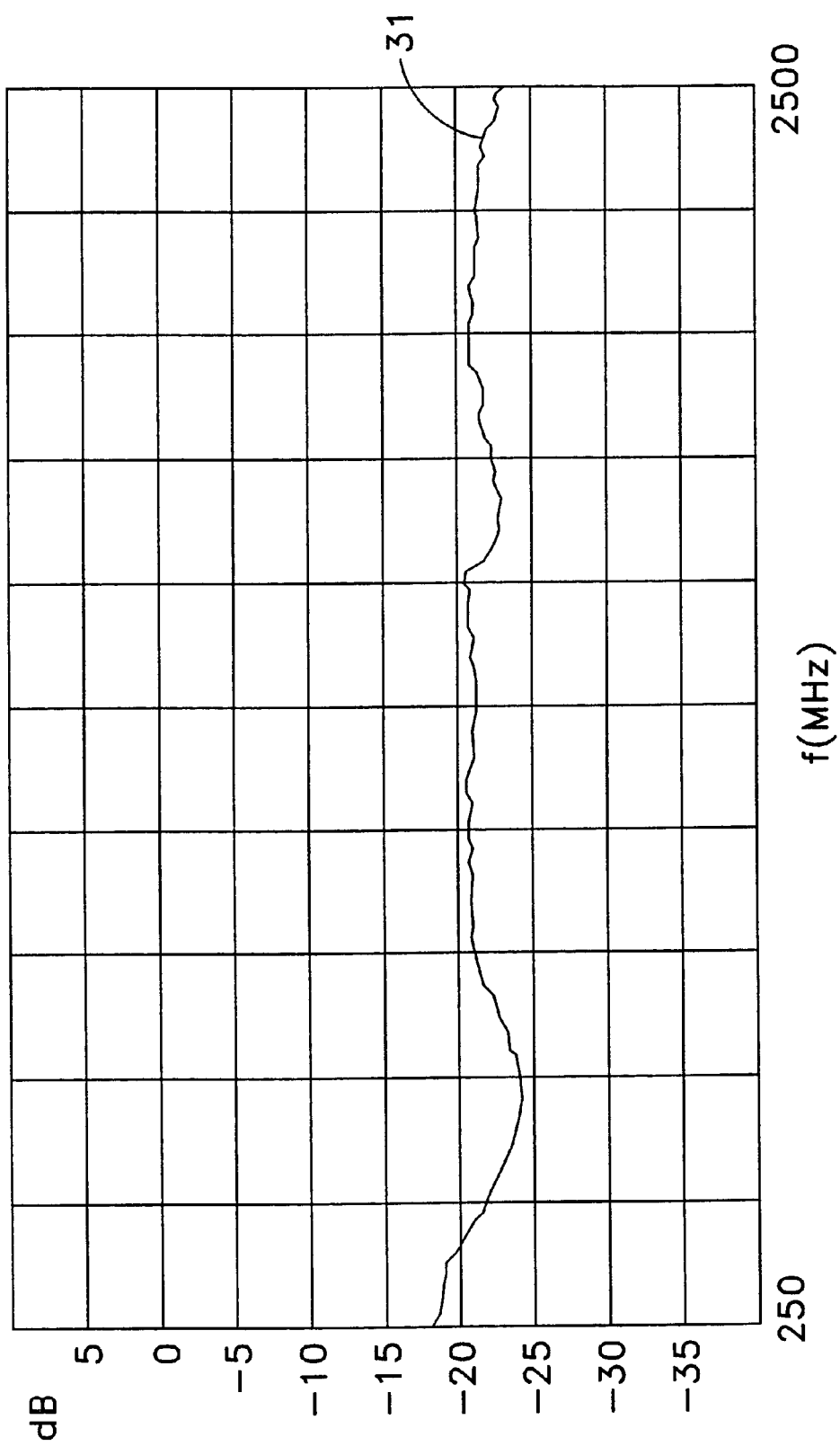
FIG. 5 is a graph depicting an isolation characteristic for the RF signal divider of FIG. 1.

Graph 30 in FIG. 4 depicts the measured insertion loss for an RF signal divider 10 constructed in accordance with FIG. 1 using the above specified specific values and a tapered transmission line embodiment of the input impedance transformer 15 such as shown in FIG. 2. The graph indicates that actual insertion loss closely matches the predicted loss across the entire band from 250 to 2500 MHz, a 10:1 bandwidth ratio. Likewise, graph 31 in FIG. 5 shows that in practice the isolation characteristic closely matches the predicted −22.4 dB isolation characteristic across this same 10:1 bandwidth. Consequently the circuits shown in FIG. 10 provides insertion losses and isolation over a wide bandwidth in the 250 to 2500 MHz frequency range that are acceptable in many applications.

Figure 6A:
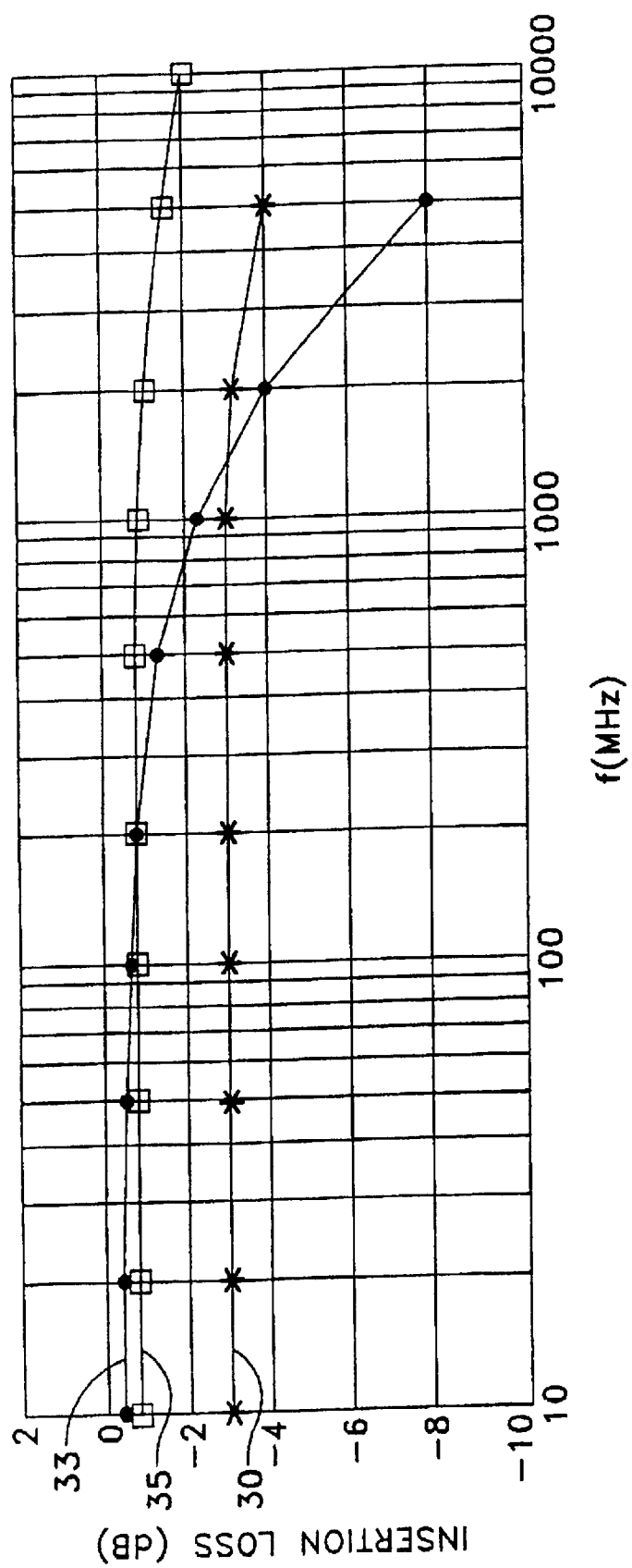
FIGS. 6A and 6B present a graphical analysis comparing insertion loss characteristics and physical space requirements for a specific embodiment of an RF signal divider shown in FIG. 1 and other types of prior art RF signal dividers.
Figure 6B:
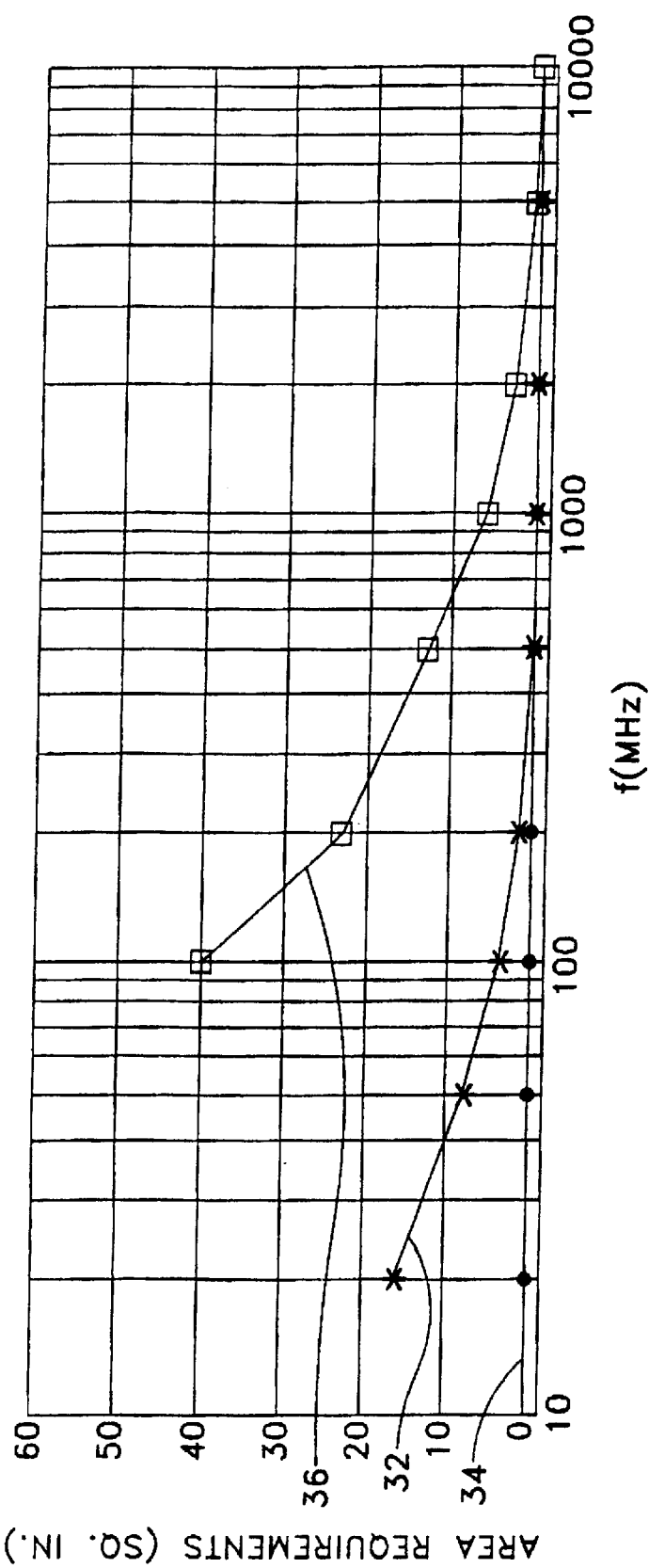

FIGS. 6A and 6B compare two characteristics of the RF signal divider 10 shown in FIG. 1 using the input impedance transformed 15 of FIG. 2 with other prior art RF signal dividers. Graph 30 in FIG. 6A illustrates the insertion loss characteristic of FIG. 4 expanded over the 10 to 10,000 MHz frequency range. As will be apparent, the insertion loss is relatively constant to 1000 MHz and then increases slightly to 4000 MHz. Graph 32 in FIG. 6B depicts the physical area that is required to implement this circuit. The area decreases to a substantially constant level at about 200 MHz.

Graph 33 in FIG. 6A depicts the insertion loss for a conventional wound ferrite transformer implementation of a signal divider. It has a better insertion loss characteristic than the circuit in FIG. 1 to about 1200 MHz and then rapidly increases. However, the physical area required for implementing such a device is small, as represented by graph 34 in FIG. 6B.

Tapered transmission lines provide very good insertion loss over the entire frequency range as graph 35 in FIG. 6A illustrates. However, as frequencies go below 5000 MHz, the area requirements for such a circuit become quite large as shown by graph 36 in FIG. 6B.

An analysis of FIGS. 6A and 6B indicates therefore the RF signal divider 10 in FIG. 1 provides overall improvement in the range of about 250 MHz to 2500 MHz. The insertion losses at the upper frequencies are superior to those of wound ferrite implementation and the physical area requirement is significantly less than that required for a tapered transmission line implementation. Thus, for many applications the the RF signal divider 10 in FIG. 1 will provide an excellent solution in the 250 to 2500 MHz range, especially if constraints on requirements for physical area and costs exist.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. An RF divider comprising:
    A) an RF input connection for receiving RF signals from an RF source,
    B) a plurality of RF output connections,
    C) a plurality of resistors, each said resistor defining a resistive path from one of said RF output connections to a common node, and
    D) an RF impedance transformation path between said common node and the RF input connection whereby signals at said RF input connection pass through said RF transformation path and divide among said plurality of resistive paths to provide a plurality of RF signals of equal amplitude and phase at said RF output connections and whereby the signals at each of said RF output connections is isolated from the signals at the others of said RF output connections.

2. An RF divider as recited in claim 1 wherein said RF transformation path comprises an RF transformer.

3. An RF divider as recited in claim 1 wherein said RF transformation path comprises an impedance matching wound ferrite RF transformer.

4. An RF divider as recited in claim 1 wherein said RF transformation path comprises an impedance matching tapered transmission line.

5. An RF divider as recited in claim 1 wherein each of said resistive paths has an equal resistance and electrical length.

6. An RF divider for receiving a single RF input signal and producing a plurality of RF output signals of equal amplitude and phase, said RF divider comprising:
    A) an input impedance transformer for receiving the RF input signal, and B) a resistor for each of the plurality of RF output signals, each said resistor conveying its respective RF signal along a resistive path from said input impedance transformer as an RF output signal, each of the RF output signals being isolated from the others of the RF output signals.

7. An RF divider as recited in claim 6 wherein said input impedance transformer comprises an RF transformer.

8. An RF divider as recited in claim 6 wherein said input impedance transformer comprises a wound ferrite RF transformer.

9. An RF divider as recited in claim 6 wherein said input impedance transformer comprises a impedance matching tapered trans mission line.

10. An RF divider as recited in claim 6 wherein each of said resistive paths has an equal resistance and length.

11. An RF divider comprising:
C) an RF input connection for receiving RF signals from an RF source,
D) a plurality of RF output connections,
E) a resistor constituting the sole RF resistive path from each said RF output connection to a common node, and
F) an RF impedance transformation path constituting the sole RF path between said common node and said RF input connection whereby signals at said RF input connection pass through said RF transformation path and divide among said plurality of RF resistive paths to provide a plurality of RF signals of equal amplitude and phase at said RF output connections and whereby the signals at each of said RF output connections is isolated from the signals at the others of said RF output connections.

12. An RF divider as recited in claim 11 adapted for use in an RF system with a characteristic impedance, $Z_L$, with N output connections wherein each said resistive path has a value, $R_X$, determined by:

$$R_X = \frac{N-1}{N+1} Z_L.$$

13. An RF divider as recited in claim 12 wherein said RF impedance transformation path has an output impedance determined by:

$$Z_Q = \frac{Z_L + R_X}{N}.$$

14. An RF divider as recited in claim 13 wherein said RF impedance transformation path comprises a wound ferrite RF transformer having impedances of $Z_L$ and $Z_Q$ at its primary and secondary windings, respectively.

15. An RF divider as recited in claim 13 wherein said RF impedance transformation path comprises an impedance matching tapered transmission line having impedances corresponding to $Z_L$ and $Z_Q$ at its input and output, respectively.

* * * * *